United States Patent
Zhang et al.

(10) Patent No.: US 6,391,694 B1
(45) Date of Patent: *May 21, 2002

(54) MANUFACTURING METHOD OF SEMICONDUCTOR INTEGRATED CIRCUIT

(75) Inventors: Hongyong Zhang; Hideto Ohnuma; Yasuhiko Takemura, all of Kanagawa (JP)

(73) Assignee: Semiconductor Energy Laboratory Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/257,049

(22) Filed: Feb. 25, 1999

Related U.S. Application Data

(62) Division of application No. 08/367,427, filed as application No. PCT/GB98/00311 on Feb. 12, 1998, now Pat. No. 5,904,509.

(30) Foreign Application Priority Data

Jan. 8, 1994 (JP) .............................. 6-12150
Feb. 12, 1997 (GB) ............................. 9702857

(51) Int. Cl.[7] .................... H01L 21/00; H01L 21/84
(52) U.S. Cl. ................ 438/164; 438/149; 438/151; 438/154; 438/163
(58) Field of Search ................. 438/149, 151, 438/154, 163

(56) References Cited

U.S. PATENT DOCUMENTS

| | | | |
|---|---|---|---|
| 4,435,896 A | 3/1984 | Parrillo et al. | 437/34 |
| 4,530,150 A | 7/1985 | Shirato | 437/34 |
| 4,577,391 A | 3/1986 | Hsia et al. | 437/44 |
| 4,599,789 A | 7/1986 | Gasner | 437/34 |
| 4,642,878 A | 2/1987 | Maeda | 437/34 |
| 4,753,898 A | 6/1988 | Parrillo et al. | 437/34 |
| 4,764,477 A | 8/1988 | Chang et al. | 437/44 |
| 4,908,327 A | 3/1990 | Chapman | 437/34 |
| 4,956,311 A | 9/1990 | Liou et al. | 437/34 |
| 5,341,012 A | 8/1994 | Misawa et al. | |
| 5,501,989 A | 3/1996 | Takayama et al. | 437/41 TFT |
| 5,576,556 A | 11/1996 | Takemura et al. | 257/69 |
| 5,712,495 A | 1/1998 | Suzawa | 25/51 |
| 5,899,709 A * | 5/1999 | Yamazaki et al. | |
| 5,913,112 A * | 6/1999 | Yamazaki et al. | |

FOREIGN PATENT DOCUMENTS

| | | |
|---|---|---|
| JP | 64-84745 | 3/1989 |
| JP | 1-310574 | 12/1989 |
| JP | 2-159730 * | 6/1990 |
| JP | 3-95965 | 4/1991 |
| JP | 3-174764 | 7/1991 |
| JP | 05-160153 | 6/1993 |
| JP | 05-267667 | 10/1993 |
| JP | 6-59279 | 3/1994 |
| JP | 6-301056 | 10/1994 |

* cited by examiner

*Primary Examiner*—Long Pham
*Assistant Examiner*—Scott Brairton
(74) *Attorney, Agent, or Firm*—Jeffrey L. Costellia; Nixon Peabody LLP

(57) ABSTRACT

In a source/drain doping step in manufacturing a field effect transistor, particularly a thin-film transistor (TFT), high-speed boron ions are implanted in a state that an active layer in which to form the source and drain is covered with an insulating film, whereas phosphorus ions are implanted in a state that the surface of the active layer is exposed.

63 Claims, 6 Drawing Sheets

MANUFACTURING METHOD OF SEMICONDUCTOR INTEGRATED CIRCUIT

Figure 1A:
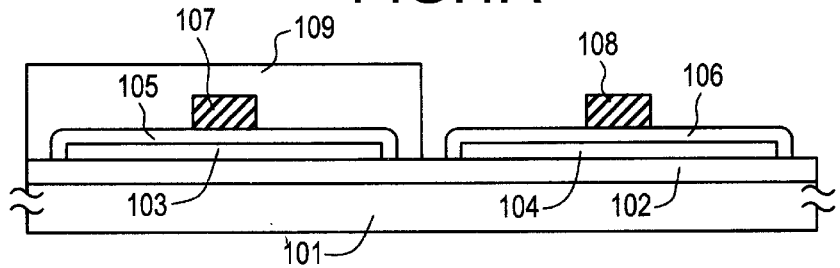
Figure 1B:
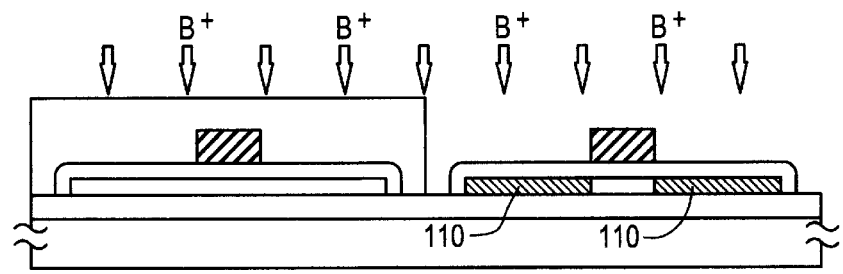

This application is a divisional application of Ser. No. 08/367,427, filed Dec. 30, 1994, now U.S. Pat. No. 5,904,509, which is a 371 of PCT/GB98/0031 filed Feb. 12, 1998.

FIELD OF THE INVENTION

The present invention relates to a manufacturing method of semiconductor devices. More specifically, the present invention relates to an improvement for introducing impurity ions into a semiconductor layer. Further, the present invention also relates to a method for manufacturing a semiconductor integrated circuit in which N-channel and P-channel thin-film transistors (hereinafter called "TFTs") are formed on an insulating surface of a single substrate. The invention also relates to a manufacturing method of integrated circuits having TFTs such as a liquid crystal display device and a three-dimensional integrated circuit and in particular, integrated circuits (CMOS circuits) having complementary MOS (metal-oxide-semiconductor) or MIS (metal-insulator-semiconductor) field-effect devices.

PRIOR ART

In recent years, insulated-gate semiconductor devices in which a thin-film active layer (or active region) is formed on an insulating substrate have been investigated. In particular, thin-film insulated-gate transistors have been investigated eagerly. The TFTs are intended to be used for control of individual pixels in display devices having a matrix structure such as a liquid crystal display device, and classified into amorphous silicon TFTs, polycrystalline silicon TFTs, etc. in terms of a semiconductor material used and its crystal structure.

Polycrystalline TFTs are also used in a single crystal silicon integrated circuit (SOI technique), as load transistors in a highly integrated SRAM, for instance. Amorphous silicon TFTs are hardly used in this application.

A semiconductor circuit formed on an insulating substrate can operate at very high speed, because it is free of capacitive coupling between the substrate and the wiring. Techniques have been developed which are intended to use such a semiconductor circuit as an ultrahigh-speed microprocessor or memory.

Since amorphous semiconductors generally have a small electric field mobility, they cannot be used for a TFT that is required to operate at high speed. Further, amorphous silicon of P-type has a very small electric field mobility to disable manufacture of a P-channel TFT (PMOS TFT). Therefore, a complementary MOS (CMOS) circuit cannot be formed by combining PMOS TFTs with N-channel TFTs (NMOS TFTs) in the case of using amorphous silicon.

In contrast polycrystalline semiconductors have a larger electric field mobility than amorphous semiconductors and, therefore, can operate at high speed. For example, there has been reported a TFT which uses a silicon film re-crystallized by laser annealing and has an electric field mobility as large as 300 $cm^2/Vs$. This is a very large value in view of the fact that a MOS transistor formed on an ordinary single crystal silicon substrate has an electric field mobility of about 500 $cm^2/Vs$. In contrast to the fact that a MOS circuit formed on a single crystal silicon has a limited operating speed due to parasitic capacitances between the substrate and the wiring, a TFT circuit, which is formed on an insulating substrate, is free of such a limitation, to assure a very-high-speed operation.

Further, polycrystalline silicon can provide both NMOS TFTs and PMOS TFTs in a similar manner, to enable manufacture of a CMOS circuit. For example, in an active matrix type liquid crystal display device, a device having a monolithic structure is known in which not only an active matrix portion but also peripheral circuits (drivers etc.) are composed of CMOS polycrystalline TFTs.

These features of the TFT are considered also in the above-mentioned TFTs used in a SRAM, in which PMOS TFTs are used as load transistors.

The thickness of an active layer of a TFT should be 100–2,000 Å and, preferably, 200–1,000 Å. For example, in a doping step of TFTs, doping impurities need to be implanted into a layer of the above thickness at an optimum concentration. Further, in general, a gate insulating film formed on the active layer of a TFT should be 500–3,000 Å, which is thicker than that of a VLSI. Therefore, the direct application of a doping technique in the conventional semiconductor integrated circuit technologies, particularly through-doping, causes some difficulties. The through-doping is a technique in which an active layer (semiconductor surface) is doped with a gate insulating film formed thereon.

For example, in the case of implanting boron (mass number 11) as P-type impurities, through-doping with ions of boron and hydrogen bromide can be performed at a relatively low acceleration voltage of less than 70 kV, for instance 40–65 kV, because they are light. However, in the case of implanting phosphorus (mass number 31) or arsenic (75) as N-type impurities ions of phosphorus and hydrogen phosphide need to be accelerated at a high voltage of more than 80 kV, for instance 85–110 kV, because they are heavy. Where a substrate having an insulating surface is irradiated with ions having such a high energy, device characteristics are likely deteriorated by, for instance, charge-up of the substrate. In addition, where an organic material such as a resist is applied as a mask to a substrate to effect selective ion implantation, it may be carbonized to make its peeling difficult.

SUMMARY OF THE INVENTION

In view of the above circumstances in the art, an object of the present invention is to provide a most suitable doping technique. More specifically, although not exclusively, it is an object of the present invention to form a CMOS device with a high efficiency.

According to the invention, in the case of implanting a light element, for instance, boron, impurities are implanted into an active layer through a gate insulating film. On the other hand, in the case of implanting a heavy element such as phosphorus or arsenic into an active layer, doping is performed after at least a portion of the gate insulating film in a region for implantation is removed or made thinner to allow a sufficient amount of the heavy element to reach the active layer.

With the above technique, the acceleration voltage of ions including heavy ions of phosphorus, arsenic or the like can be reduced to as low a voltage as 10–30 kV. Since an amount of ions which are conventionally absorbed by a gate insulting film now effectively reach a source and a drain, the necessary dose can be reduced. Further, as a result of these advantages, the invention can solve the charge-up problem and the difficulty of peeling off a mask material.

BRIEF DESCRIPTION OF THE INVENTION

Figure 4A:
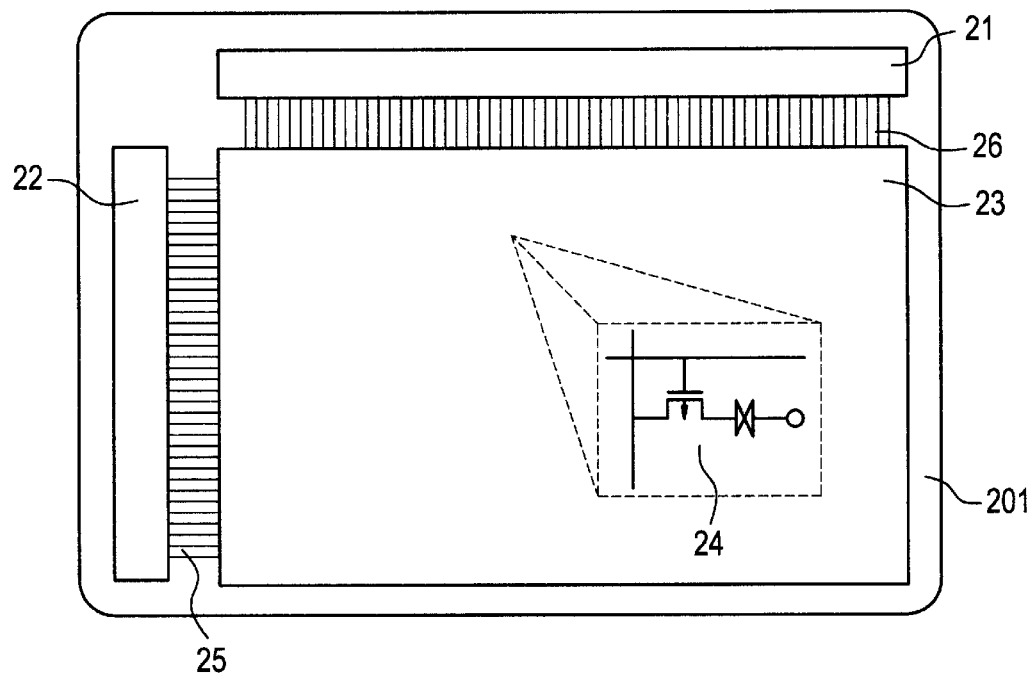
Figure 4B:
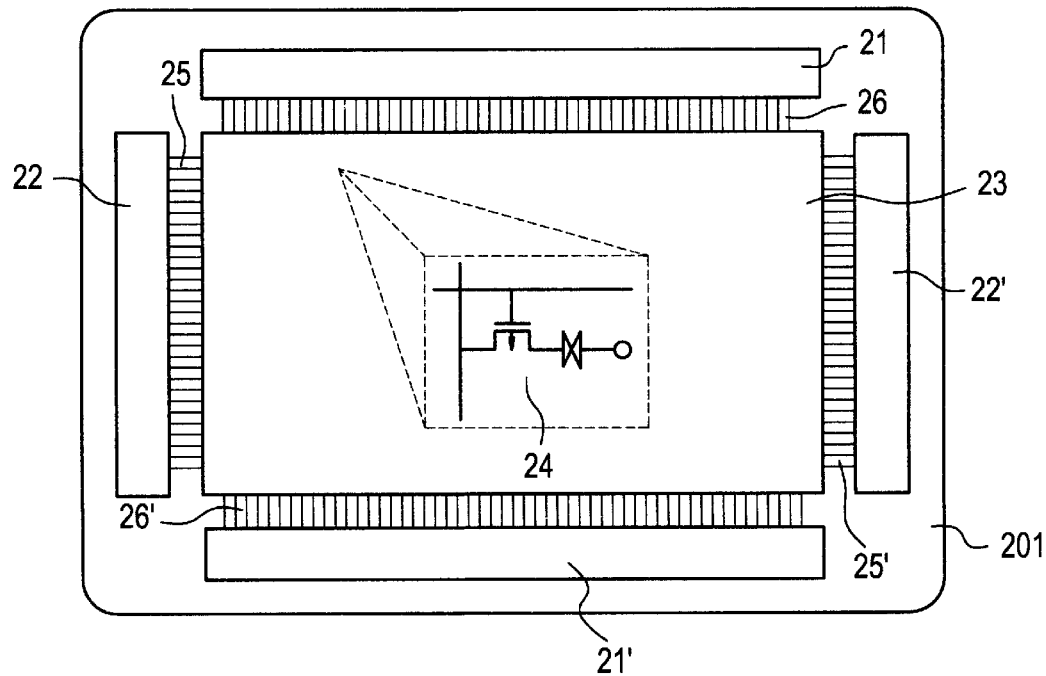

FIGS. 1(A)–1(E) show manufacturing steps according to a first embodiment of the present invention;

FIGS. 2(A)–2(E) show manufacturing steps according to a second embodiment of the invention;

FIGS. 3(A)–3(F) show manufacturing steps according to a third embodiment of the invention;

FIGS. 4(A) and 4(B) show liquid crystal display devices to which the manufacturing steps of FIGS. 2(A)–2(E) are to be applied;

FIGS. 5(A)–5(E) show manufacturing steps according to a fourth embodiment of the invention; and FIGS. 6(A)–6(D) show manufacturing steps according to a fifth embodiment of the invention.

DESCRIPTION OF THE PREFERRED EMBODIMENTS

The present invention will be hereinafter described in detail by way of several embodiments.

Embodiment 1

FIGS. 1(A)–1(E) show steps for producing NMOS devices and PMOS devices according to a first embodiment of the invention. In this embodiment, TFTs were produced by a high-temperature process. First, a 2,000 Å thick silicon oxide film 102 was formed, as an undercoat, on a quartz substrate 101 (105 mm (width)×105 mm (length)×1.1 mm (thickness)). An impurity non-doped amorphous silicon film of 100–2,000 Å, preferably 500–1,500 Å in thickness was formed by reduced-pressure CVD using disilane as a material. The substrate temperature in forming the amorphous silicon film was set at 150–550° C.

The amorphous silicon film was patterned into island-like silicon regions 103 and 104, which were then crystallized by thermal annealing at 500–750° C. Then, the crystallized silicon regions 103 and 104 were oxidized in an oxygen atmosphere, to form on their surfaces silicon oxide films 105 and 106 of 500–1,500 Å, preferably 500–700 Å in thickness. The temperature was set at 850–1,100° C. The range of 950–1,050° C. was particularly preferable. The crystallization may be effected by laser light or high-intensity light equivalent to it.

In the step of crystallizing the amorphous silicon film by thermal annealing, the crystallizing temperature could be lowered and a silicon film superior in crystallinity was obtained by adding a very small quantity of an element which facilitates the crystallization of amorphous silicon, such as nickel, cobalt and copper. In this case, it is preferred that the concentration of such a catalyst element be less than $1×10^{20}$ atoms/cm$^3$ and, typically, in the range of $1×10^{15}$ to $1×10^{19}$ cm$^{-3}$.

Subsequently, a silicon film which is doped with phosphorous at $1×10^{18}$ to $2×10^{20}$ cm$^{-3}$, for instance $8×10^{19}$ cm$^{-3}$ is formed to a thickness of 2,000–5,000 Å, preferably 3,500–4,000 Å, and is patterned into a gate 107 of an N-channel TFT (NMOS) and a gate 108 of a P-channel TFT (PMOS). Then, a photoresist mask 109 was formed so as to cover the NMOS region (FIG. 1(A)).

Then, ions including boron were implanted by plasma doping. In the plasma doping, which is also called ion doping, a gas containing a doping impurity element is subjected to discharging to render it in a plasma state, and then guided out and accelerated by means of a high voltage so as to be implanted into an object. This doping method is characterized in that various kinds of ions are implanted because mass separation of ions is not effected, which is in contrast to the cases of other known ion implantation methods. For example, to implant boron, diborane is used as a gas. In this case, however, not only B (boron) ions, but also other ions of BH, BH$_2$, and H are implanted.

The plasma doping is a simple and convenient doping method and can be used for purposes where high accuracy is not required. In this embodiment. P-type impurity regions 110 and 111 were formed by a doping operation in which the acceleration voltage was 30–70 kV, preferably 50–65 kV and the dose was $1×10^{14}$ to $6×10^{15}$ cm$^{-2}$, preferably $5×10^{14}$ to $2×10^{15}$ cm$^{-2}$. These regions serve as a source and a drain of the PMOS TFT (FIG. 1(B)).

After the boron doping, ashing was performed in oxygen plasma to lightly oxidize and then remove a surface layer of the resist mask 109, and the resist mask 109 was removed by immersing it in a peeling liquid. Then, a new photoresist mask 112 was formed by a known photolithography method so that the island-like silicon region 103 of the NMOS TFT was exposed except its peripheral portion. The reason why the peripheral portion of the silicon region 103 was covered with the mask 112 is to prevent the undercoat film 102 from being etched in the following step of removing the silicon oxide film 105.

Figure 1C:
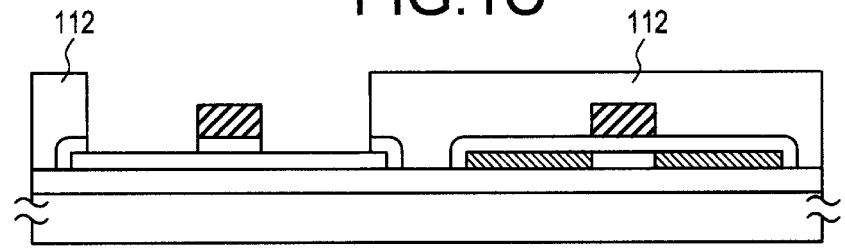
Figure 1D:
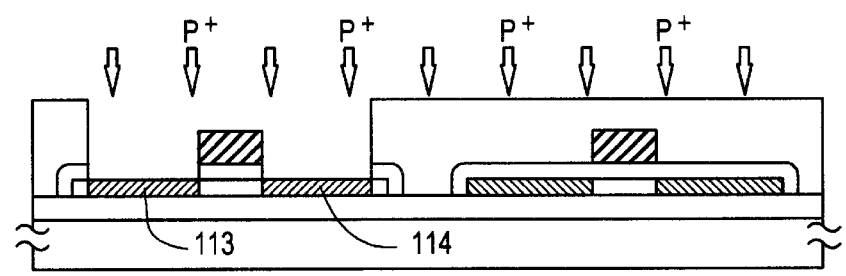
Figure 1E:
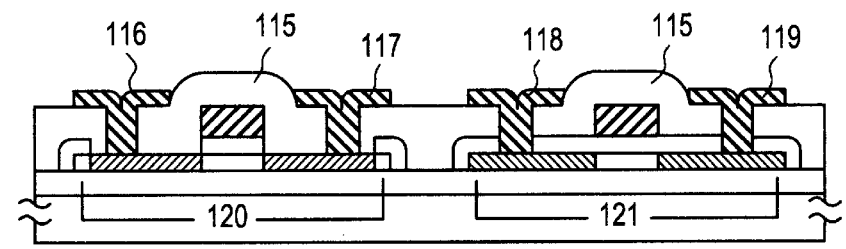

Then, the silicon oxide film 105 was etched using the mask 112, to thereby expose the silicon region 103 (FIG. 1(C)).

Then, ions including phosphorus were implanted into the island-like silicon region 103 by plasma doping. N-type impurity regions 113 and 114 were formed by a doping operation in which phosphine was used as a gas, and the acceleration voltage was 10–30 kV, preferably 10–20 kV and the dose was $1×10^{14}$ to $6×10^{15}$ cm$^{-2}$, preferably $5×10^{14}$ to $2×10^{15}$ cm$^{-2}$. These regions serve as a source and a drain of the NMOS TFT (FIG. 1(D)).

After the formation of the impurity regions 113 and 114, ashing was performed in oxygen plasma to lightly oxidize and then remove a surface layer of the resist mask 112, and the resist mask 112 was removed by being immersed in a peeling liquid. Since ions including phosphorus were implanted at a low acceleration voltage, the resist mask 112 was removed in a short time. Then, thermal annealing was performed at 650–1,050° C. for instance 750° C. to restore crystallinity of the impurity regions 113 and 114 which was damaged by the doping step. Thereafter, as in the case of the conventional TFT manufacturing process, an interlayer insulating material (phosphorus–boron glass) 115 was deposited, and flattened by reflowing. Contact holes were formed in the interlayer insulating material 115, and metal wirings 116–119 were formed therein. As a result of the above steps, the NMOS TFT 120 and the PMOS TFT 121 were formed (FIG. 1(E)).

Embodiment 2

Referring to FIGS. 2(A)–2(E), a description will be made of a manufacturing process of a liquid crystal display having a CMOS circuit according to a second embodiment of the invention. In this embodiment, as shown in FIG. 4(A), a liquid crystal display device was formed on a substrate 201 which device has a display circuit section (active matrix) 23 and its drive circuits (peripheral circuits, i.e., a data driver 21 and a gate driver 22). The drive circuits are constituted with CMOS circuits. More specifically, the drive circuits 21 and 22 are formed in the peripheral region of the substrate, and the active matrix 23 is formed in the central portion with PMOS TFTs. The driver circuits 21 and 22 are connected with the active matrix 23 through gate lines 25 and data lines 25.

Alternatively, as shown in FIG. 4(B), peripheral circuits, i.e., data drivers 21 and 21' and gate drivers 22 and 22' may be formed on all four sides of an active matrix 23.

The active matrix 23 is constituted with pixel cells 24 each having a PMOS TFT. The reason why PMOS TFTs are used in the active matrix 23 is that they have a small source–drain leak current in a non-selected state and, therefore, are superior in the ability of retaining charge in the pixels. A manufacturing process of the device of FIG. 4(A) or 4(B) will be described with reference to FIGS. 2(A)–2(E).

A Corning 7059 glass was used as the substrate 201. Although other various kinds of substrates can be used, a proper measure should be taken for each substrate to prevent movable ions such as sodium from entering a semiconductor film. The ideal substrate is a synthesized quartz substrate having a small alkali concentration. However, where it cannot be used in terms of the cost, low-alkali glass or non-alkali glass, each being on the market, may be used. In this embodiment, to prevent movable ions from entering from the substrate 201, a silicon oxide film 202 was formed on the substrate 201 at a thickness of 200–10,000 Å, for instance 2,000 Å. The thickness of the coating 202 is designed in accordance with the degree of entrance of movable ions or their influences on an active layer.

Thereafter, an amorphous silicon film of 200–2,000 Å, for instance 1,000 Å in thickness was formed by plasma CVD by using monosilane as a starting material. The substrate temperature was set at 160–400° C., for instance 250° C. Further, a silicon oxide film of 200–1,000 Å in thickness was formed thereon as a protection film. The amorphous silicon film thus formed was crystallized by performing thermal annealing at 600° C. for 24 hours.

To facilitate the crystallization of a top portion of the silicon film, it is desired that the concentration of each of carbon, nitrogen and oxygen that are contained in the silicon film to facilitate its crystallization be less than $7\times10^{19}$ $cm^{-3}$. In this embodiment, it was confirmed by a SIMS analysis that the concentration was less than $1\times10^{17}$ $cm^{-3}$.

After the amorphous silicon film was converted to a crystalline structure by thermal annealing the crystalline silicon film was etched into an appropriate pattern to form an island-like semiconductor region 203 for a peripheral CMOS circuit and an island-like semiconductor region 204 for a pixel TFT.

Then, a gate insulating film (silicon oxide) 205 was formed at a thickness of 500–3,000 Å, for instance 1,200 Å by sputtering in an oxygen atmosphere using silicon oxide as a target. The thickness of the gate insulating film 205 is determined based on the operating conditions of the TFTs and the like.

Then, an aluminum film (including scandium by 0.05–0.5 wt %, preferably 0.1–0.3 wt %) was formed by sputtering at a thickness of 3,000 Å to 5 μm, for instance 5,000 Å, and patterned with a mixed acid (a phosphoric acid solution added with a 5% nitric acid), to form gate electrodes and wiring. The etching rate was 225 nm/min when the etching temperature was set at 40° C. Thus, the outer shapes of the TFTs were provided.

Further, an aluminum oxide coating was formed on the surface of the aluminum wiring by anodic oxidation. The anodic oxidation was performed by a method invented by the present inventors and disclosed in U.S. Pat. No. 5.308.998 issued May 3, 1994. Details of the anodic oxidation may be modified according to the intended characteristics of the device, process conditions, investment scale, etc. In this embodiment, an aluminum oxide coating 207 of 1,000–3,000 Å, for instance 2,000 Å in thickness was formed around the wiring 206 by the anodic oxidation. Thus, a gate electrode/wiring 208 for the NMOS TFT, a gate electrode/wiring 209 for the PMOS TFT, and a gate electrode/wiring 210 for the pixel TFT were formed (FIG. 2(A)).

Thereafter, ions including boron were implanted into the entire substrate by plasma doping. As for the doping conditions, the acceleration voltage was 30–70 kV, for instance 65 kV, and the dose was $1\times10^{14}$ to $6\times10^{15}$ $cm^{-2}$, for instance $1\times10^{15}$ $cm^{-2}$. As a result, P-type impurity regions 211–215 were formed in the island-like silicon regions 203 and 204 (FIG. 2(B)).

Then, the silicon oxide film 205 was etched out with a buffered hydrofluoric acid solution, and a photoresist mask 216 was formed. As in the case of the first embodiment, an opening was formed in the photoresist 216 in an area that includes regions into which phosphorus is to be implanted (i.e., regions to become a source and a drain of the NMOS TFT). Then, ions including phosphorus were implanted by plasma doping. As for the doping conditions, the acceleration voltage was 10–30 kV, for instance 10 kV, and the dose was $1\times10^{14}$ to $6\times10^{15}$ $cm^{-2}$, for example, $2\times10^{15}$ $cm^{-2}$. As a result, parts of the regions 211 and 212 of the island-like silicon region 203 became regions 217 and 218 (regions to become a source and a drain of the NMOS TFT) with their conductivity type changed from P to N. The other parts of the island-type silicon region 203, i.e., regions 219 and 220 (regions to become a source and drain of the PMOS TFT) kept their conductivity type P. A peripheral portion 211' of the NMOS TFT also kept its conductivity type P. Entirely covered with the resist, the regions 214 and 215 of the island-like silicon region 204 (pixel TFT) remains P-type (FIG. 2(C)).

After the formation of the impurity regions, ashing was performed in oxygen plasma to lightly oxidize and then remove a surface layer of the resist mask 216, and the resist mask 216 was removed by being immersed in a peeling liquid.

Figure 2A:
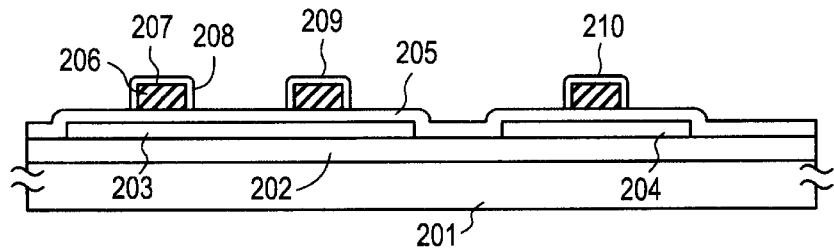
Figure 2B:
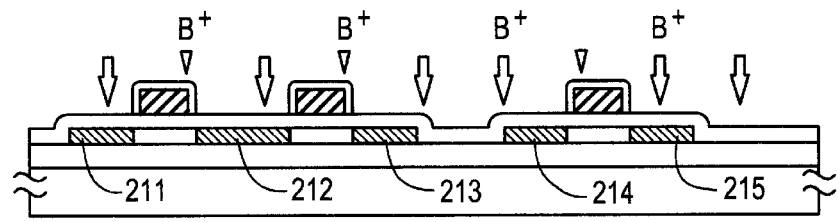
Figure 2C:
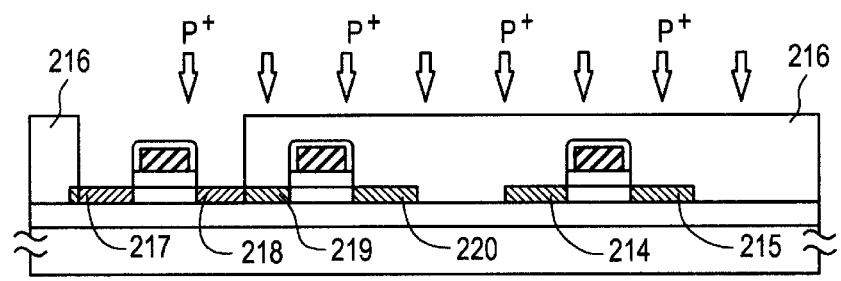
Figure 2D:
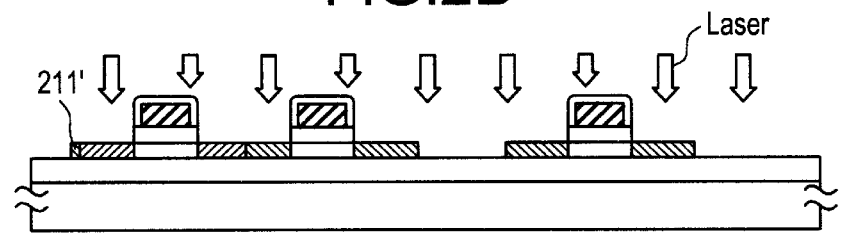
Figure 2E:
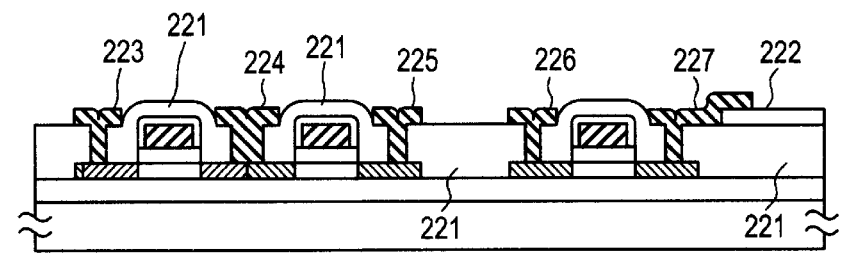

Thereafter, the source and drain regions were re-crystallized by laser annealing with the gate portions used as a mask (FIG. 2(D)). The laser annealing was performed under conditions disclosed in, for instance. U.S. Pat. No. 5,308,998. In this embodiment, during the laser annealing, there exists no silicon oxide film or the like on the surface of the silicon film to be annealed, which means a reduced loss of laser light due to absorption. Sufficient annealing was observed even with a laser light energy density that is as low as 50–80% of that disclosed in the above publications, resulting in an improved laser processing ability.

Thereafter, a silicon oxide film 221 was formed, as an interlayer insulating film, by RF plasma CVD at a thickness of 3,000 Å to 3 μm, for instance 5,000 Å. Further, an ITO (indium tin oxide) film was formed by sputtering at a thickness of 500–1,000 Å, for instance 800 Å, and patterned by etching, to form a pixel electrode 222 of the active matrix. Then, openings were then formed in the silicon oxide film 221 and aluminum wiring lines 223–227 were formed. Thus, the peripheral CMOS circuit and the pixel TFT were completed (FIG. 2(E)).

This embodiment is different from the first embodiment in that selective doping was not performed in the boron doping. Therefore, this embodiment eliminated one photolithography step and one mask material removing step. Further, since the silicon oxide film (gate insulating film) 205 was removed completely in the phosphorus doping, the contact holes that were formed in the later step had the same depth for the NMOS TFT and the PMOS TFT.

In this embodiment, the gate electrode is offset from the source and drain because of the anodic oxide film formed on the side faces of the gate electrode. As a result, the breakdown voltage was increased and the source-drain leak current was reduced.

Embodiment 3

FIGS. 3(A)–3(F) show a third embodiment. First, a silicon oxide film of 1,000–3,000 Å in thickness was formed as an undercoat oxide film 302 on a substrate 301 (Corning 7059, 300 mm×400 mm or 100 mm×100 mm). An amorphous silicon film of 100–3,000 Å, preferably 500–1,000 Å in thickness was deposited thereon by plasma CVD or LPCVD, and was crystallized by being left for 24 hours in a reducing atmosphere of 550–600° C. This step may be performed by laser beam illumination. The crystallized silicon film was patterned to form an island-like region 303 for an NMOS TFT and an island-like region 304 for a PMOS TFT. Further, a silicon oxide film 305 was formed thereon by sputtering at a thickness of 700–1,500 Å, for instance 1,200 Å.

Then, an aluminum film containing Si of 1 wt % or Sc of 0.1–0.3 wt % was formed at a thickness of 1,000 Å to 3 μm by electron beam evaporation or sputtering. A photoresist film (for instance, OFPR 800/30 cp produced by Tokyo Ohka Kogyo Co., Ltd.) was formed thereon by spin coating. If an aluminum oxide film of 100–1,000 Å in thickness was formed on the aluminum film by anodic oxidation before forming the photoresist film, good adhesiveness was provided between the aluminum film and the photoresist film and a porous anodic oxide film was effectively formed on the side faces of a gate electrode in a later anodic oxidation step due to a suppressed leak current through the photoresist film. Then, the photoresist film was patterned and the aluminum film was etched, to form gate electrodes 306 and 307 on the respective island-like regions 303 and 304. Mask films 308 and 309 remain on the gate electrodes. Examples of the material of the mask films 308 and 309 other than the above material are photosensitive polyimide and ordinary polyimide capable of being etched.

Figure 3A:
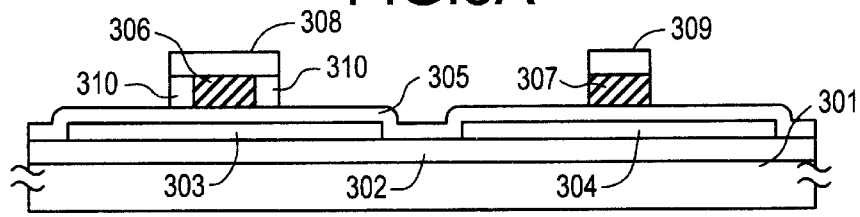
Figure 3B:
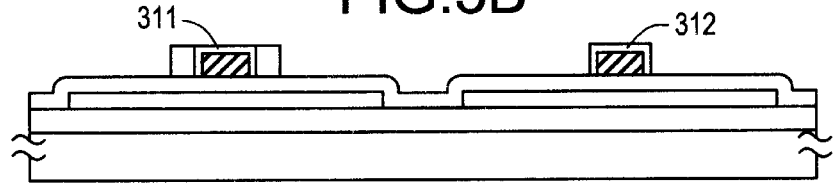
Figure 3C:
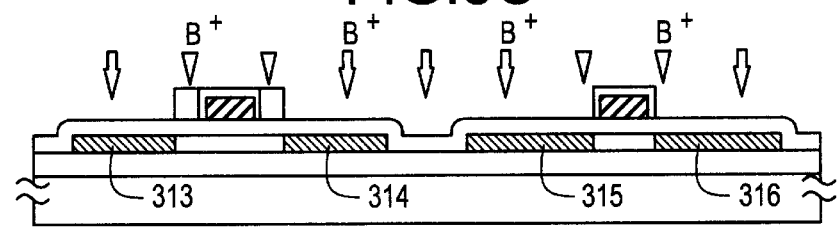
Figure 3D:
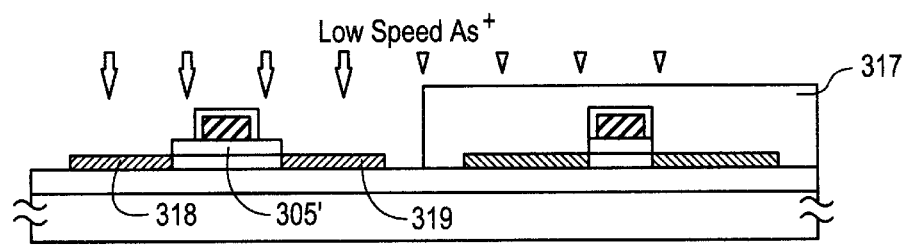
Figure 3E:
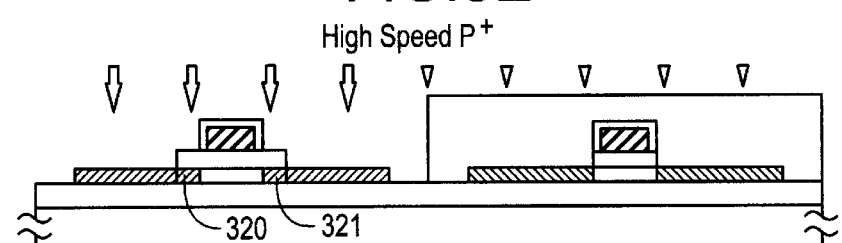
Figure 3F:
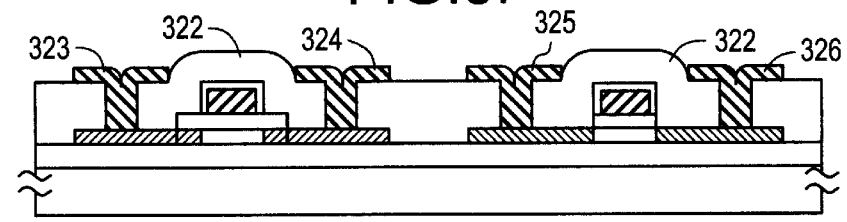

Then, a porous anodic oxide film 310 of 3,000–6,000 Å, for instance 5,000 Å in thickness was formed on the side faces of only the gate electrode 306 of the NMOS TFT by allowing a current to flow therethrough in an electrolytic solution (FIG. 3(A)). It is desired that a circuit be established which allows a current to flow through only the NMOS TFT. The anodic oxidation may be performed in an acid aqueous solution of citric acid (3–20%), nitric acid, phosphoric acid, chromic acid, sulfuric acid, or the like by applying a constant current with a voltage of 10–30 V to the gate electrode. In this embodiment, the anodic oxidation was performed for 20–40 minutes in an oxalic acid solution at 30° C. by applying 10 V. The thickness of the anodic oxide film was controlled by the anodic oxidation time.

After the masks 308 and 309 were removed, a current was caused to flow through the gate electrodes 306 and 307 in an electrolytic solution. This time, an ethylene glycol solution containing a tartaric acid solution (3–10%), boric acid and nitric acid was used, and a current was caused to flow through both NMOS and PMOS TFTs. Better oxide films were obtained when the temperature of the solution was lower than a room temperature that was about 10° C. In this step, barrier type anodic oxide films 311 and 312 were formed on the top and side faces of the gate electrodes 306 and 307. The thickness of the barrier type anodic oxide films 311 and 312 was proportional to the application voltage. The thickness was 2,000 Å when the application voltage was 150 V (FIG. 3(B)).

It should be noted that although the barrier type anodic oxidation was performed in the later step, the barrier type anodic oxide film 311 was formed between the porous anodic oxide film 310 and the gate electrode 306 rather than outside the porous anodic oxide film 310.

Accelerated ions including boron were implanted into the active layer over the entire surface of the above structure. As for the doping conditions, the acceleration voltage was 30–70 kV, for instance 65 kV, and the dose was $1\times10^{14}$ to $6\times10^{15}$ cm$^{-2}$, for instance $5\times10^{14}$ cm$^{-2}$. As a result, P-type impurity regions 313–316 were formed in the island-like silicon regions 303 and 304 (FIG. 3(C)).

Then, the insulating film 305 was etched by dry etching, wet etching, or some other method. In this etching step, the portions of the insulating film 305 covered with the anodic oxide films 310–312 and the gate electrodes 306 and 307 are substantially not etched. More specifically, where the gate electrodes 306 and 307 are mainly made of aluminum, tantalum and titanium and the insulating film 305 is mainly made of silicon oxide, and dry etching is employed using a fluoride type etching gas (for instance, $NF_3$ or $SF_6$), the insulating film 305 (silicon oxide) is etched fast but the etching rates of aluminum oxide, tantalum oxide and titanium oxide are sufficiently small. Therefore, the insulating film 305 can be etched selectively.

In the case of employing wet etching, a hydrofluoric acid type etchant such as a 1/100 hydrofluoric acid may be used. Also in this case, the insulating film 305 can be selectively etched, because the insulating film 305 (silicon oxide) is etched fast but the etching rates of aluminum oxide, tantalum oxide and titanium oxide are sufficiently small.

Then, the anodic oxide films 310 were etched by a mixed acid of phosphoric acid, acetic acid and nitric acid. With this phosphoric acid type etchant, the etching rate of the porous anodic oxide was more than 10 times higher than that of the barrier type anodic oxide. Therefore, the barrier type anodic oxide films 311 and 312 were substantially not etched, and the gate electrodes 306 and 307, which were located inside the respective anodic oxide films 311 and 312, were protected from the etching. In this etching step, the etching rate of the porous anodic oxide films 310 was about 600 Å/min. The portions of the gate insulating film (silicon oxide) 305 under the porous anodic oxide films 310 and the barrier type anodic oxide films 311 and 312 were left as they were.

Then, as in the case of the first embodiment, a photoresist mask 317 was formed so as to cover the PMOS TFT region. Ions including arsenic were implanted by plasma doping. As for the doping conditions, the acceleration voltage was 10–30 kV, for instance 10 kV, and the dose was $1\times10^{14}$ to $6\times10^{15}$ cm$^{-2}$, for instance $1\times10^{15}$ cm$^{-2}$. As a result, the P-type regions 313 and 314 of the island-like silicon region 303 were changed to N-type regions 318 and 319 (regions to become a source and a drain of the NMOS TFT). The P-type conductivity of the regions 315 and 316 in the island-like silicon region 304 was not changed, because those regions were completely covered with the resist mask 317 (FIG. 3(D)).

Subsequently, ions including phosphorus were implanted by plasma doping in which the ion source, acceleration voltage and dose were changed. As for the doping conditions, the acceleration voltage was increased to 80–110 kV, for instance 90 kV, whereas the dose was reduced to $1\times10^{13}$ to $1\times10^{14}$ cm$^{-2}$, for instance $5\times10^{13}$. In this doping step, phosphorus ions passed through the insulating film 305' and reached the active layer, so that N-type regions 320 and 321 were formed. Since the dose was low in the regions 320 and 321, the conductivity type of the resulting impurity regions was weak N, i.e., N-(FIG. 3(E)).

Thereafter, ashing was performed in oxygen plasma to lightly oxidize and then remove a surface layer of the resist mask 317, and the resist mask 317 was removed by being immersed in a peeling liquid. In this embodiment, there might be a concern that the high acceleration energy of the high-speed ion implantation step causes carbonization of the resist, to make it difficult to peel off the resist mask 317. However, since the dose of high-speed ions was less than 1/10 of that of low-speed ions, their influences on the resist mask 317 were sufficiently small and caused almost no problem in the actual process.

Then, as in the case of the second embodiment, impurity ions introduced in the active region were activated by illumination with KrF excimer laser light (wavelength: 248 nm; pulse width: 20 nsec).

According to a SIMS (secondary ion mass spectrometry) method, the concentration of arsenic in the regions 318 and 319 was $1\times10^{20}$ to $2\times10^{21}$ cm$^{-3}$, and the concentration of phosphorus in the regions 320 and 321 was $1\times10^{17}$ to $2\times10^{18}$ cm$^{-3}$. The above concentrations correspond to doses of $5\times10^{14}$ to $5\times10^{15}$ cm$^{-2}$ and $1\times10^{13}$ to $1\times10^{14}$ cm$^{-2}$, respectively.

Then, a silicon oxide film 322 was formed as an interlayer insulating film by RF plasma CVD at a thickness of 3,000 Å to 3 μm, for instance 5,000 Å. Electrode formation openings were formed in the silicon oxide film 322, and aluminum wiring lines 323–326 were formed.

In this embodiment, while the PMOS TFT had the same structure as that of the second embodiment, the NMOS TFT had a structure that is close to the lightly doped drain structure (hereinafter the regions 320 and 321 are called high-resistivity regions). This effective in reducing influences of deteriorations due to hot carriers, which deteriorations likely occur in the NMOS TFT.

It might be considered that it is preferable for the PMOS TFT to have high-resistivity regions similar to those of the NMOS TFT. This is not impossible and the invention does not deny its effectiveness. However, in practice, it is not preferable, because an actual drain current unduly decreases if the high-resistivity regions (serving as a resistor connected in series between the source and drain) are provided in spite of the fact that the electric field effect mobility of the PMOS TFT is usually about a half of that of the NMOS TFT.

On the contrary, it is preferable to employ the ordinary structure in the PMOS TFT that is less likely to be deteriorated by hot carriers and form the high-resistivity regions only in the NMOS TFT that has a large mobility but is likely deteriorated by hot carriers, in which case actual drain currents of the NMOS TFT and the PMOS TFT are balanced properly. But this is not necessarily applied to TFTs that are produced according to less-than-submicron design rules, in which case deteriorations due to hot carriers are not negligible even in PMOS TFTs.

Embodiment 4

FIGS. 5(A)–5(E) show a fourth embodiment. First, a silicon oxide film of 1,000–3,000 Å in thickness was formed as an undercoat oxide film 502 on a substrate 501 (Corning 7059, 300 mm×400 mm or 100 mm×100 mm). An amorphous silicon film of 100–3,000 Å, preferably 500–1,000 Å in thickness was deposited thereon by plasma CVD or LPCVD, and was crystallized by being left for 24 hours in a reducing atmosphere of 550–600° C. The crystallized silicon film was patterned to form an island-like region 503 (for an NMOS TFT) and an island-like region 504 (for a PMOS TFT). Further, a silicon oxide film 505 was formed thereon by plasma CVD at a thickness of 700–1,500 Å, for instance 1,200Å.

Then, an aluminum film (containing Si of 1 wt % or Sc of 0.1–0.3 wt %) was formed at a thickness of 1,000 Å to 3 μm by sputtering. The aluminum film was patterned to form a gate electrode/wiring 506 (for the NMOS TFT) and a gate electrode/wiring 509 (for the PMOS TFT). Then, as in the case of the second embodiment, barrier type anodic oxide films 507 and 509 were formed by anodic oxidation. By setting the anodic oxidation time for the NMOS TFT longer than that for the PMOS TFT, the thickness of the anodic oxidation film 507 on the gate electrode/wiring 506 of the NMOS TFT was made 2,000–3,000 Å and the thickness of the anodic oxidation film 509 on the gate electrode/wiring 508 of the PMOS TFT was made 500–1,000 Å (FIG. 5(A)).

Accelerated ions including boron were implanted into the active layer by plasma doping over the entire surface of the above structure. As for the doping conditions, the acceleration voltage was 30–70 kV, for instance 65 kV, and the dose was $1\times10^{14}$ to $6\times10^{15}$ cm$^{-2}$, for instance $5\times10^{14}$ cm$^{-2}$. As a result, P-type impurity regions 510–513 were formed in the island-like silicon regions 503 and 504 (FIG. 5(B)).

Thereafter, the insulating film 505 was etched by dry etching, wet etching, or some other method. Then, as in the case of the first embodiment, a photoresist mask 514 was formed so as to cover the PMOS TFT region. Ions including phosphorus were then implanted by plasma doping. As for the doping conditions, the acceleration voltage was 10–30 kV, for instance 10 kV, and the dose was $5\times10^{14}$ to $5\times10^{15}$ cm$^{-2}$, for instance $1\times10^{15}$ cm$^{-2}$. As a result, the P-type regions 510 and 511 of the island-like silicon region 503 were changed to N-type regions 515 and 516 (regions to become a source and a drain of the NMOS TFT). (FIG. 5(C)

Subsequently, ions including phosphorus were implanted by plasma doping in which the acceleration voltage and the dose were changed. As for the doping conditions, the acceleration voltage was increased to 65–110 kV, for instance 80 kV, whereas the dose was reduced to $1\times10^{13}$ to $5\times10^{14}$ cm$^{-2}$, for instance $5\times10^{13}$, which dose was more than one order lower than in the case of forming the source and drain. In this doping step, as indicated by dashed lines in FIG. 5(D), phosphorus ions passed through the active layer and reached the deep portion of the undercoat film 502. Ions spread in the horizontal direction as well as in the vertical direction, because the ion directivity is not good in ion doping methods. However, since the dose was low in this doping step, the conductivity type of the resulting impurity regions was weak N, i.e., N-(FIG. 5(D)).

Although in this embodiment low–speed ions were implanted first and high-speed ions were then implanted, the order may apparently be reversed. Low–speed ions and high-speed ions may be implanted even at the same time. Further, the kinds of doping impurities that are implanted as high-speed ions and low-speed ions may be changed from those in this embodiment. For example, high-speed ions and low-speed ions may be highly diffusive phosphorus ions and arsenic ions that are relatively less likely to diffuse, respectively.

Figure 5A:
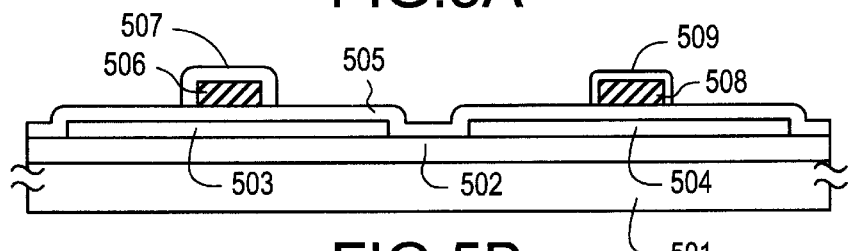
Figure 5B:
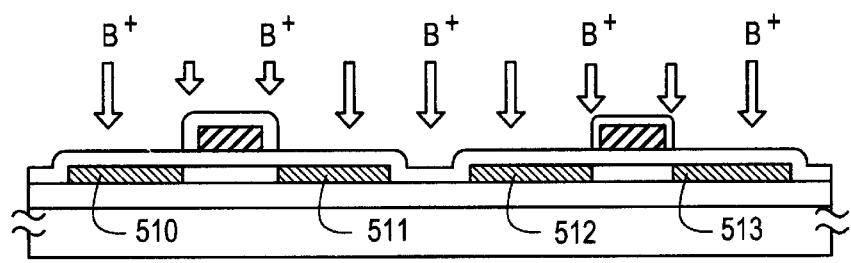
Figure 5C:
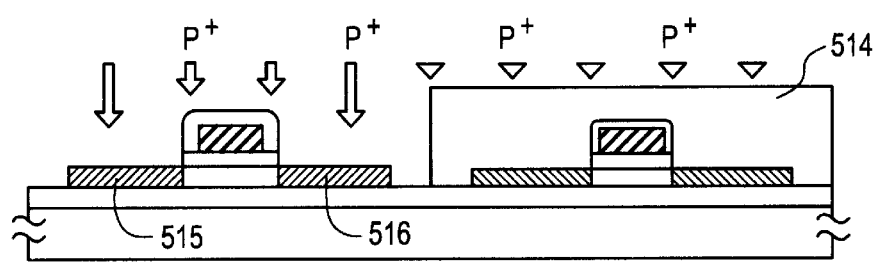
Figure 5D:
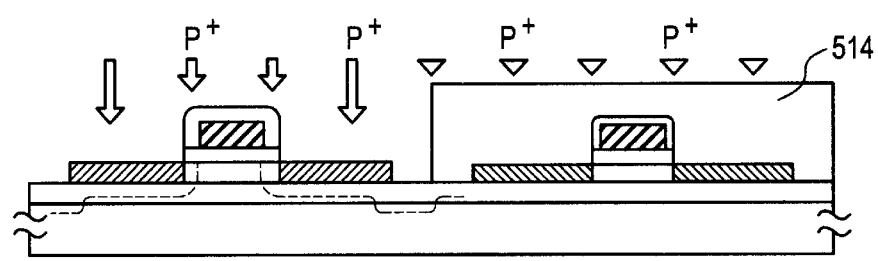
Figure 5E:
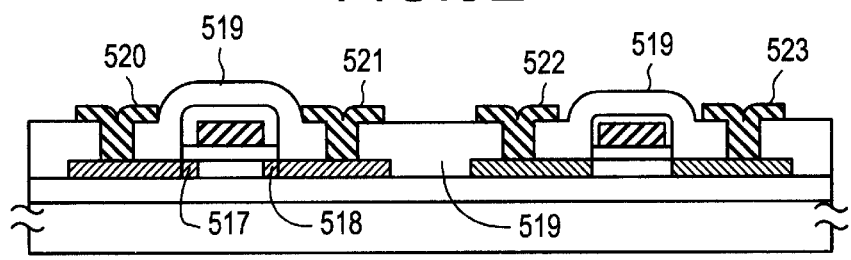
Figure 6A:
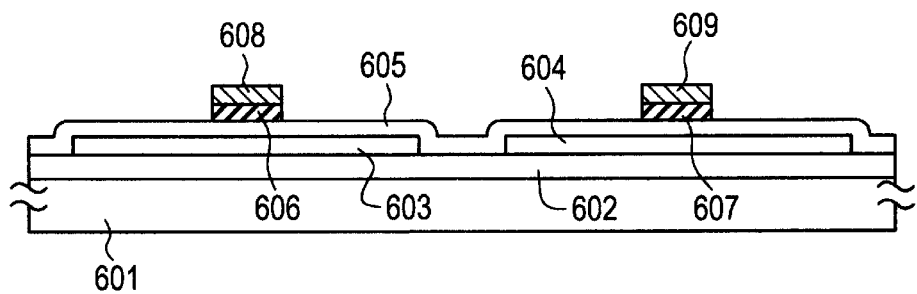
Figure 6B:
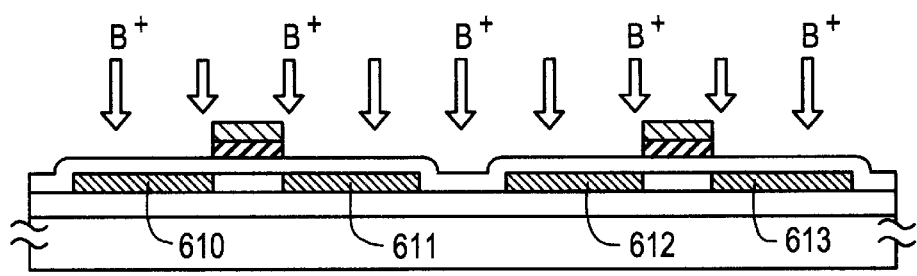
Figure 6C:
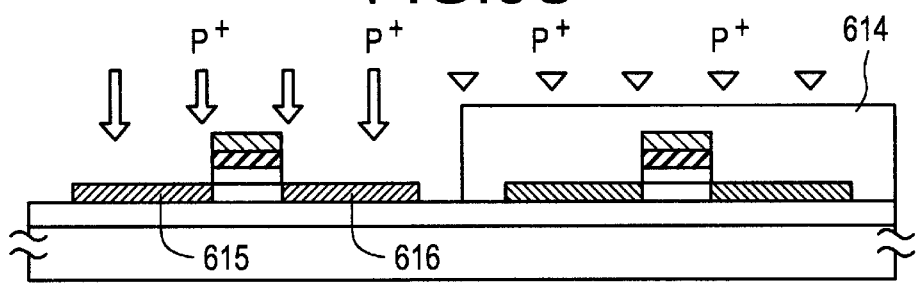
Figure 6D:
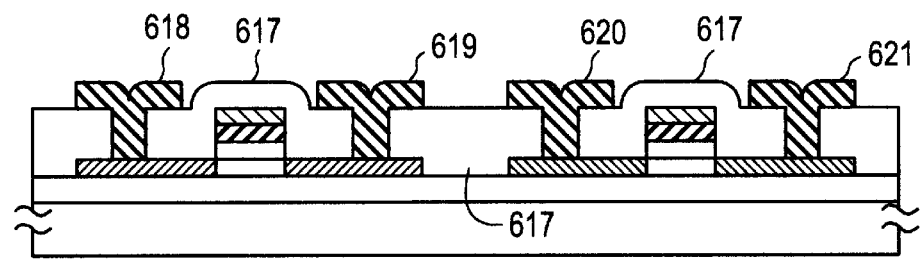

Thereafter, ashing was performed in oxygen plasma to lightly oxidize and then remove a surface layer of the resist mask 514, and the resist mask 514 was removed by being immersed in a peeling liquid. Then, as in the case of the second embodiment, impurity ions introduced in the active region were activated by illumination with KrF excimer laser light (wavelength: 248 nm; pulse width: 20 nsec). As a result, lower concentration N-type impurity regions 517 and 518 were formed adjacent to the N-type impurity regions 515 and 516. Although boundaries between the regions 515 and 517 and between the regions 516 and 518 are shown in FIG. 5(E) for convenience, it should be noted that actually the boundaries are not clear and the concentration varies gradually there.

According to a SIMS (secondary ion mass spectrometry) analysis, the impurity concentration was $1\times10^{20}$ to $2\times10^{21}$ $cm^{-3}$ in the regions 515 and 516, and $1\times10^{17}$ to $2\times10^{18}$ $cm^{-3}$ in the regions 517 and 518. The above concentrations correspond to doses of $5\times10^{14}$ to $5\times10^{15}$ $cm^{-2}$ and $2\times10^{13}$ to $5\times10^{14}$ $cm^{-2}$, respectively.

Then, a silicon oxide film 519 was formed as an interlayer insulating film by RF plasma CVD at a thickness of 3,000 Å to 3 μm, for instance 5,000 Å. Electrode formation openings were formed in the silicon oxide film 519, and aluminum wiring lines 520–523 were formed.

In this embodiment, due to different thicknesses of the anodic oxide films 507 and 509, the NMOS and PMOS TFTs have different offsets. In addition, since the two-step doping was performed in forming the NMOS TFT, it was possible to form the regions 517 and 518 which are lower in impurity concentration than the adjacent source and drain. The regions 517 and 518 have the same effect as the corresponding regions in the lightly doped drain structure of the third embodiment; that is, they are effective in reducing influences of deteriorations due to hot carriers. As is apparent from a comparison with the third embodiment, this embodiment can provide the structure equivalent to the lightly doped drain structure more easily.

Embodiment 5

FIGS. 6(A)–6(D) show a fifth embodiment. First, a silicon oxide film of 1,000–3,000 Å in thickness was formed as an undercoat oxide film 602 on a substrate 601 (NA35 produced by NH Technoglass Corp., 300 mm×400 mm or 100 mm×100 mm). An amorphous silicon film of 100–3,000 Å, preferably 500–1,000 Å in thickness was deposited thereon by plasma CVD or LPCVD, and was crystallized by being left for 24 hours in a reducing atmosphere of 550–600° C. The crystallized silicon film was patterned to form an island-like region 603 for an NMOS TFT and an island-like region 604 for a PMOS TFT. Further, a silicon oxide film 605 was formed thereon by plasma CVD at a thickness of 700–1,500 Å, for instance 1,200 Å.

Then, an N-type polycrystalline silicon film was deposited by a reduced pressure CVD at a thickness of 500–2,000 Å, and a tungsten silicide film, a molybdenum silicide film, or titanium silicide film was formed thereon by sputtering at a thickness of 2,000 Å to 3 μm. These films were patterned to form gate electrode/wirings comprising silicon films 606 and 607 and coatings 608 and 609 of tungsten suicide or the like, (FIG. 6(A)).

Accelerated ions including boron were implanted into the active layer over the entire surface of the above structure. As for the doping conditions, the acceleration voltage was 30–70 kV, for instance 65 kV, and the dose was $1\times10^{14}$ to $6\times10^{15}$ $cm^{-2}$, for instance $5\times10^{14}$ $cm^{-2}$. As a result, P-type impurity regions 610–613 were formed in the island-like silicon regions 603 and 604 (FIG. 6(B)).

Thereafter, the insulating film 605 was etched by dry etching, wet etching, or some other method. Then, as in the case of the first embodiment, a photoresist mask 614 was formed so as to cover the PMOS TFT region. Ions including phosphorus were then implanted by plasma doping. As for the doping conditions, the acceleration voltage was 10–30 kV, for instance 10 kV, and the dose was $1\times10^{14}$ to $6\times10^{15}$ $cm^{-2}$, for instance $1\times10^{15}$ $cm^{-2}$. As a result, the P-type regions 610 and 611 of the island-like silicon region 603 were changed to N-type regions 615 and 616 (regions to become a source and a drain of the NMOS TFT), (FIG. 6(C)).

Thereafter, ashing was performed in oxygen plasma to lightly oxidize and then remove a surface layer of the resist mask 614, and the resist mask 614 was removed by being immersed in a peeling liquid. Then, as in the case of the second embodiment, impurity ions introduced in the active region were activated by illumination with KrF excimer laser light (wavelength: 248 nm; pulse width: 20 nsec). Then, a silicon oxide film 617 was formed as an interlayer insulating film by RF plasma CVD at a thickness of 3,000 Å to 3 μm, for instance 5,000Å. Openings were formed in the silicon oxide film 617, and aluminum wiring lines 618–621 were formed therein.

Although the above embodiments are directed to only the case of forming TFTs on a glass substrate or the like, it is apparent that the invention can also be applied to a three-dimensional integrated circuit in which an integrated circuit is formed, via an insulating film, on another integrated circuit that is formed in a surface portion of a single crystal semiconductor.

In addition, the invention can be applied to not only MIS circuits but also manufacture of bipolar transistors. For example, an NPN bipolar transistor can be produced such that a base is formed by selectively implanting boron ions into an N-type semiconductor coating through a silicon oxide film and adding phosphorus after removing or thinning the silicon oxide film. This type of bipolar transistors can be formed on the same substrate as a MIS device, to produce a Bi-CMOS circuit.

While various embodiments have been described, it is to be understood that the scope of the present invention will be limited only by the appended claims and that many modifications may be made within the concept of the invention.

What is claimed is:

1. A method of manufacturing a semiconductor device comprising the steps of:

forming a semiconductor island over a substrate having an insulating surface, said semiconductor island having at least one region for a channel region;

forming an insulating film on said semiconductor island;

forming at least one gate electrode adjacent to said region for the channel region;

introducing ions including boron into said semiconductor island in a self-alignment manner with respect to said gate electrode through said insulating film;

etching a portion of said insulating film uncovered by at least said gate electrode to expose a selected portion of said semiconductor island, said selected portion excluding the channel region; and introducing ions including phosphorus into said selected portion of said semiconductor island.

2. A method according to claim 1 wherein said ions including boron contain B ions, BH ions, and $BH_2$ ions.

3. A method according to claim 1 wherein said ions including boron are originated from $B_2H_6$ gas.

4. A method according to claim 1 wherein said ions including phosphorus are originated from $PH_3$ gas.

5. A method according to claim 1 wherein the step of introducing said ions including boron is performed with a larger accelerating voltage than the step of introducing the ions including phosphorus.

6. A method according to claim 5 wherein the step of introducing said ions including boron is performed with an accelerating voltage of 30–70 kV and the step of introducing the ions including phosphorus is performed with an accelerating voltage of 10–30 kV.

7. A method according to claim 5 wherein the step of introducing said ions including boron is performed with an accelerating voltage of 50–65 kV and the step of introducing the ions including phosphorus is performed with an accelerating voltage of 10–20 kV.

8. A method according to claim 1 wherein the step of introducing the ions including boron is performed with a smaller dose than the step of introducing the ions including phosphorus.

9. A method according to claim 8 wherein the step of introducing said ions including boron is performed with a dose of $1 \times 10^{14}$–$1 \times 10^{15}$ cm$^{-2}$ and the step of introducing the ions including phosphorus is performed with a dose of $1 \times 10^{14}$–$1 \times 10^{15}$ cm$^{-2}$.

10. A method according to claim 1 said semiconductor device comprises top-gate type MOS transistors.

11. A method for manufacturing a semiconductor device comprising the steps of:

forming a semiconductor layer over a substrate having an insulating surface, said semiconductor layer comprising at least one region for a channel region;

forming an insulating film on said semiconductor layer;

forming a gate electrode adjacent to said channel region;

introducing ions including boron into said semiconductor layer except for the channel region through said insulating film;

removing at least one portion of said insulating film to expose at least one selected portion of said semiconductor layer, said selected portion excluding said channel region; and introducing ions including phosphorus into said selected portion of said semiconductor layer, said selected portion excluding the channel region, wherein an accelerating voltage for the step of introducing the ions including boron is higher than that for the step of introducing the ions including phosphorus.

12. A method according to claim 11 wherein said ions including boron contain B ions, BH ions, and BH$_2$ ions.

13. A method according to claim 11 wherein said ions including boron are originated from B$_2$H$_6$ gas.

14. A method according to claim 11 wherein said ions including phosphorus are originated from PH$_3$ gas.

15. A method according to claim 11 wherein the step of introducing said ions including boron is performed with an accelerating voltage of 30–70 kV and the step of introducing the ions including phosphorus is performed with an accelerating voltage of 10–30 kV.

16. A method according to claim 11 wherein the step of introducing said ions including boron is performed with an accelerating voltage of 50–65 kV and the step of introducing the ions including phosphorus is performed with an accelerating voltage of 10–20 kV.

17. A method according to claim 11 wherein the step of introducing the ions including boron is performed with a smaller dose than the step of introducing the ions including phosphorus.

18. A method according to claim 17 wherein the step of introducing said ions including boron is performed with a dose of $1 \times 10^{14}$–$1 \times 10^{15}$ cm$^{-2}$ and the step of introducing the ions including phosphorus is performed with a dose of $1 \times 10^{14}$–$1 \times 10^{15}$ cm$^{-2}$.

19. A method according to claim 11 wherein said semiconductor device comprises top-gate type MOS transistors.

20. A method according to claim 11 wherein said first accelerating voltage is 30–70 kV and said second accelerating voltage is 10–30 kV.

21. A method according to claim 11 wherein said first accelerating voltage is 50–65 kV and said second accelerating voltage is 10–20 kV.

22. A method of manufacturing a semiconductor device comprising the steps of:

forming at least one semiconductor island over a substrate having an insulating surface, said semiconductor island having at least one region for a channel region;

forming an insulating film on said semiconductor island;

introducing ions including boron into said semiconductor island in a self-alignment manner with respect to a gate electrode through said insulating film at a first dose;

etching a portion of said insulating film to expose a selected portion of said semiconductor island; and introducing ions including phosphorus into said selected portion of said semiconductor island at a second dose, said selected portion excluding the channel region in the semiconductor island, wherein said second dose is higher than said first dose.

23. A method according to claim 22 wherein said ions including boron contain B ions, BH ions, and BH$_2$ ions.

24. A method according to claim 22 wherein said ions including boron are originated from B$_2$H$_6$ gas.

25. A method according to claim 22 wherein said ions including phosphorus are originated from PH$_3$ gas.

26. A method according to claim 22 wherein an accelerating voltage of ions including phosphorus is lower that of ions including boron.

27. A method according to claim 22 wherein said semiconductor device comprises top-gate type MOS transistors.

28. A method of manufacturing a semiconductor device having at least one CMOS transistor comprising a P-channel transistor and N-channel transistor, said method comprising the steps of:

forming first and second semiconductor islands over a substrate having an insulating surface, each of said first and second semiconductor islands comprising at least one region for a channel region;

forming an insulating film over an entire surface of said first and second semiconductor islands;

forming at least first and second gate electrodes adjacent to the first and second semiconductor islands, respectively;

introducing ions including boron into said first and second semiconductor islands except for each channel region through said insulating film;

removing portions of said insulating film on the first semiconductor island;

introducing ions including phosphorus into exposed portions of said first semiconductor island, said selected portion excluding the channel region in the first semiconductor island.

29. A method according to claim 28 wherein said ions including boron contain B ions, BH ions, and BH$_2$ ions.

30. A method according to claim 28 wherein said ions including boron are originated from B$_2$H$_6$ gas.

31. A method according to claim 28 wherein said ions including phosphorus are originated from PH$_3$ gas.

32. A method according to claim 28 wherein the step of introducing said ions including boron is performed with a larger accelerating voltage than the step of introducing the ions including phosphorus.

33. A method according to claim 32 wherein the step of introducing said ions including boron is performed with an accelerating voltage of 30–70 kV and the step of introducing the ions including phosphorus is performed with an accelerating voltage of 10–30 kV.

34. A method according to claim 32 wherein the step of introducing said ions including boron is performed with an accelerating voltage of 50–65 kV and the step of introducing the ions including phosphorus is performed with an accelerating voltage of 10–20 kV.

35. A method according to claim 28 wherein the step of introducing the ions including boron is performed with a smaller dose than the step of introducing the ions including phosphorus.

36. A method according to claim 35 wherein the step of introducing said ions including boron is performed with a dose of $1 \times 10^{14}$–$1 \times 10^{15}$ cm$^{-2}$ and the step of introducing the ions including phosphorus is performed with a dose of $1 \times 10^{14}$–$1 \times 10^{15}$ cm$^{-2}$.

37. A method according to claim 28 wherein said CMOS transistor is top-gate type.

38. A method of manufacturing a semiconductor device having CMOS transistors, each comprising a P-channel transistor and an N-channel transistor, said method comprising the steps of:

forming first and second semiconductor islands over an insulating surface, each of the first and second semiconductor islands having at least one region for a channel region;

forming at least first and second gate electrodes adjacent to said first and second semiconductor islands with an insulating film interposed therebetween, respectively;

performing a first ion doping of ions including boron into said first and second semiconductor islands except for each channel region through said insulating film at a first dose amount;

etching portions of said insulating film over the first semiconductor island;

performing a second ion doping of ions including phosphorous into said selected portion of said first semiconductor island, said selected portion excluding the channel region in the first semiconductor island, wherein a second dose amount is larger than said first dose amount.

39. A method according to claim 38 wherein said ions including boron contain B ions, BH ions, and BH$_2$ ions.

40. A method according to claim 38 wherein said ions including boron are originated from B$_2$H$_6$ gas.

41. A method according to claim 38 wherein said ions including phosphorus are originated from PH$_3$ gas.

42. A method according to claim 38 wherein the first ion doping is performed with a larger accelerating voltage than the second ion doping.

43. A method according to claim 42 wherein the first ion doping is performed with an accelerating voltage of 30–70 kV and the second ion doping is performed with an accelerating voltage of 10–30 kV.

44. A method according to claim 42 wherein the first ion doping is performed with an accelerating voltage of 50–65 kV and the second ion doping is performed with an accelerating voltage of 10–20 kV.

45. A method according to claim 38 wherein said first dose amount is $1 \times 10^{14}$–$1 \times 10^{15}$ cm$^{-2}$ and said second dose amount is $1 \times 10^{14}$–$1 \times 10^{15}$ cm$^{-2}$.

46. A method according to claim 38 wherein said CMOS transistor is top-gate type.

47. A method of manufacturing a complementary semiconductor device having at least an N-MOS TFT and a P-MOS TFT, said method comprising the steps of:

patterning a semiconductor film formed over a substrate having an insulating surface into at least first and second semiconductor islands, each of said semiconductor islands including a region for a channel region;

forming an insulating film on said first and second semiconductor islands;

forming at least first and second gate electrodes adjacent to said first and second semiconductor islands, respectively;

introducing ions including boron into said first and second semiconductor islands except for each channel region;

removing potions of said insulating film over the first semiconductor island; and introducing ions into phosphorus into regions of said first semiconductor island said region excluding the each channel region, wherein an accelerating voltage of said step of introducing ions including boron is larger than that of said step of introducing ions including phosphorus.

48. A method according to claim 47 wherein said ions including boron contain B ions, BH ions, and BH$_2$ ions.

49. A method according to claim 47 wherein said ions including boron are originated from B$_2$H$_6$ gas.

50. A method according to claim 47 wherein said ions including phosphorus are originated from PH$_3$ gas.

51. A method according to claim 47 wherein the step of introducing said ions including boron is performed with an accelerating voltage of 30–70 kV and the step of introducing the ions including phosphorus is performed with an accelerating voltage of 10–30 kV.

52. A method according to claim 47 wherein the step of introducing said ions including boron is performed with an accelerating voltage of 50–65 kV and the step of introducing the ions including phosphorus is performed with an accelerating voltage of 10–20 kV.

53. A method according to claim 47 wherein the step of introducing the ions including boron is performed with a smaller dose than the step of introducing the ions including phosphorus.

54. A method according to claim 53 wherein the step of introducing said ions including boron is performed with a dose of $1 \times 10^{14}$–$1 \times 10^{15}$ cm$^{-2}$ and the step of introducing the ions including phosphorus is performed with a dose of $1 \times 10^{14}$–$1 \times 10^{15}$ cm$^{-2}$.

55. A method according to claim 47 wherein both said N-MOS TFT and said P-MOS TFT are top-gate type.

56. A method of manufacturing a complementary semiconductor device having at least an N-MOS TFT and a P-MOS TFT, said method comprising the steps of:

forming at least first and second semiconductor islands over a substrate having an insulating surface, each of said semiconductor islands including a region for a channel region;

forming an insulating film on said first and second semiconductor islands;

introducing ions including boron into said first and second semiconductor islands through said insulating film;

removing at least one portion of said insulating film over the first semiconductor island; and introducing ions into phosphorus into at least one exposed region of said first semiconductor island, wherein an accelerating voltage of said step of introducing ions including boron is larger than that of said step of introducing ions including phosphorus, and wherein a dose of said step of introducing ions including boron is smaller than that of said step of introducing ions including phosphorus.

57. A method according to claim 56 wherein said ions including boron contain B ions, BH ions, and $BH_2$ ions.

58. A method according to claim 56 wherein said ions including boron are originated from $B_2H_6$ gas.

59. A method according to claim 56 wherein said ions including phosphorus are originated from $PH_3$ gas.

60. A method according to claim 56 wherein the step of introducing said ions including boron is performed with an accelerating voltage of 30–70 kV and the step of introducing the ions including phosphorus is performed with an accelerating voltage of 10–30 kV.

61. A method according to claim 56 wherein the step of introducing said ions including boron is performed with an accelerating voltage of 50–65 kV and the step of introducing the ions including phosphorus is performed with an accelerating voltage of 10–20 kV.

62. A method according to claim 56 wherein the step of introducing said ions including boron is performed with a dose of $1 \times 10^{14} - 1 \times 10^{15}$ $cm^{-2}$ and the step of introducing the ions including phosphorus is performed with a dose of $1 \times 10^{14} - 1 \times 10^{15}$ $cm^{-2}$.

63. A method according to claim 56 wherein both said N-MOS TFT and said P-MOS TFT are top-gate type.

* * * * *